United States Patent
Lee et al.

(10) Patent No.: US 8,208,335 B2
(45) Date of Patent: Jun. 26, 2012

(54) SEMICONDUCTOR MEMORY DEVICE AND SYSTEM INCLUDING THE SAME

(75) Inventors: Dong-Hyuk Lee, Seoul (KR); Jung-Bae Lee, yongin-si (KR); Doo-Gon Kim, Hwaseong-si (KW); Cheol Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 12/821,515

(22) Filed: Jun. 23, 2010

(65) Prior Publication Data

US 2011/0116335 A1    May 19, 2011

(30) Foreign Application Priority Data

Nov. 13, 2009    (KR) ................ 10-2009-0109879

(51) Int. Cl.
    *G11C 7/00*    (2006.01)
(52) U.S. Cl. ............. 365/222; 365/189.07; 365/189.12
(58) Field of Classification Search ............ 365/222, 365/189.07, 189.12
    See application file for complete search history.

(56) References Cited

U.S. PATENT DOCUMENTS

| 6,272,588 B1 | 8/2001 | Johnston et al. |
| 6,449,204 B1 * | 9/2002 | Arimoto et al. ............... 365/222 |
| 6,925,022 B2 * | 8/2005 | Arimoto et al. ............... 365/222 |
| 7,167,403 B2 | 1/2007 | Riho et al. |
| 7,493,531 B2 * | 2/2009 | Ito et al. ........................ 714/708 |
| 2007/0242547 A1 | 10/2007 | Ahn et al. |

FOREIGN PATENT DOCUMENTS

| JP | 11-086598 A | 3/1999 |
| JP | 2005-216429 A | 8/2005 |
| JP | 2007-287314 A | 11/2007 |
| KR | 10-2005-0078242 A | 8/2005 |
| KR | 10-2007-0102235 A | 10/2007 |

* cited by examiner

*Primary Examiner* — Son Dinh
(74) *Attorney, Agent, or Firm* — Lee & Morse, P.C.

(57) ABSTRACT

A semiconductor memory device includes a cell array unit having a plurality of banks each having a plurality of blocks, and a refresh controller configured to set at least one of the blocks as a test block, perform a refresh operation on the blocks except for the test block in a self-refresh operation period, determine a refresh period of the test block, and then set another one of the blocks as the test block.

19 Claims, 10 Drawing Sheets

SEMICONDUCTOR MEMORY DEVICE AND SYSTEM INCLUDING THE SAME

BACKGROUND

1. Field

Example embodiments relate to a semiconductor memory device and a system including the same.

2. Description of Related Art

With the development of technology, semiconductor memory devices are continuously becoming more highly integrated and operated at higher speed, and are used in various products ranging from large home appliances to small mobile products. Such semiconductor memory devices each have a plurality of cells for storing data.

Cells may store data in the form of charge, the stored data being determined as "0" or "1" according to a charged amount of charge. Data stored in a cell may be discharged by leakage current and may be lost after a predetermined time. To prevent such data loss, a refresh operation, of storing data of a cell again, may be performed. Where electrical characteristics of cells are different from each other, the cells may have different discharge times. In other words, data retention times of the cells, i.e., times for which the accuracy of data can be ensured, differ from each other. To ensure the reliability of data stored in cells, the refresh operation should be performed before a data retention time passes.

SUMMARY

It is a feature of an embodiment to provide a semiconductor memory device configured to examine the refresh periods of a plurality of blocks during a normal operation rather than for additional test time, and a system including the semiconductor memory device.

It is another feature of an embodiment to provide a semiconductor memory device configured to perform a refresh operation on a plurality of blocks at two or more different refresh time intervals, and a system including the semiconductor memory device.

At least one of the above and other features and advantages may be realized by providing a semiconductor memory device, including a cell array unit having a plurality of banks, each bank having a plurality of blocks, and a refresh controller configured to set at least one of the blocks as a test block, perform a refresh operation on the blocks except for the test block in a self-refresh operation period, determine a refresh period of the test block, and then set another one of the blocks as the test block.

The refresh controller may set blocks of the respective banks corresponding to the same address as the test block.

The refresh controller may determine refresh periods of all the blocks and then exchange a block having the shortest refresh period with the test block.

The refresh controller may separately control outputting a row address for controlling the refresh operation for the blocks according to the determined refresh periods.

The refresh controller may include a refresh period setter configured to determine refresh periods of all the blocks by examining the refresh period of the test block in response to a refresh start signal activated in the self-refresh operation period and sequentially setting the blocks as the test block, and generate refresh period information of the respective blocks, a refresh period information storage configured to store the refresh period information, a block selector configured to generate respective block enable signals for controlling whether or not to use the blocks, activate block enable signals corresponding to the blocks, and activate a block enable signal corresponding to the test block in an active period of the refresh start signal, and a refresh period controller configured to sequentially determine refresh period information of the blocks when the refresh start signal is activated and control outputting a row address for controlling the refresh operation for the respective blocks according to the refresh periods.

The semiconductor memory device may further include a refresh start signal generator configured to output the refresh start signal activated when a self-refresh command is input.

The refresh period setter may determine the refresh period of the test block by writing test data into the test block in the self-refresh operation period, reading the test data several times at time intervals increasing by a predetermined time, and examining whether or not the test block has the data.

When the refresh period of the test block is determined, the refresh period setter may exchange the block with the test block by moving data stored in one of the blocks other than the test block to the test block and swapping an address corresponding to the block for an address corresponding to the test block.

The refresh period information storage may have a plurality of registers numbering as many as the blocks, the refresh period information storage being configured to store the refresh period information of the blocks respectively.

The block selector may receive addresses corresponding to the blocks and shift signals, which indicate whether or not the blocks have been exchanged with the test block, activate block enable signals to use corresponding blocks when the addresses and the shift signals are the same as previously set information and the blocks are not the test block, and deactivate a block enable signal not to use a corresponding block when the block is the test block.

The block selector may include an address input unit configured to activate a matching signal when the shift signal and the address are the same as previously set block information and a corresponding block is not the test block, and deactivate the matching signal when the block is the test block, and a block enable signal generator configured to activate a block enable signal in the self-refresh operation period when the corresponding block is the test block, and activate the block enable signal only if the matching signal is activated when the block is not the test block.

The refresh period controller may include a pulse generator configured to generate a pulse in response to the row address counted in the self-refresh operation period, a first shift register configured to sequentially activate block signals respectively corresponding to the blocks in response to the pulse, a second shift register configured to output a period signal whose level is changed in synchronization with operation of the first shift register, a refresh period information output unit configured to output refresh period information of the blocks corresponding to the activated block signals, a refresh enable signal generator configured to receive refresh period information of each of the blocks and the period signal, and generate a refresh enable signal activated when the refresh period of the block corresponds to the period signal, and a block controller configured to receive the row address, output the row address to perform the refresh operation for the block when the refresh enable signal is activated, and prevent output of the row address to skip the refresh operation for the block when the refresh enable signal is deactivated.

At least one of the above and other features and advantages may also be realized by providing a semiconductor memory device, including a cell array unit having a plurality of banks each having a plurality of blocks, and a refresh controller configured to output an end signal activated after refresh periods of all the blocks are determined by repeatedly setting at least one of the blocks as a test block, determining a refresh period of the test block when a power-up period ends, and then setting another one of the blocks as the test block.

The refresh controller may set blocks of the respective banks corresponding to the same address as the test block.

The refresh controller may determine refresh periods of all the blocks and then exchange a block having the shortest refresh period with the test block.

The refresh controller may separately control outputting a row address for controlling the refresh operation for the blocks according to the determined refresh periods.

At least one of the above and other features and advantages may also be realized by providing a system, including a control circuit configured to receive operation codes from a first memory device and output the operation codes during booting, and control operation in response to an end signal, and a second memory having a plurality of banks each having a plurality of blocks, the second memory being configured to receive the operation codes, load the operation codes into the blocks, examine refresh periods of the blocks excluding an area in which the operation codes are stored, and output the end signal activated when an active command corresponding to a block or bank whose refresh period is being examined is input or after refresh periods of all the blocks or banks are determined.

The first memory may have a slower operating speed than the second memory.

The control circuit may include a reset unit configured to stop a normal operation in response to the end signal when the end signal is in an inactive state, and switch from a non-operation state to the normal operation state when the end signal is activated.

BRIEF DESCRIPTION OF THE DRAWINGS

The above and other features and advantages will become more apparent to those of skill in the art by describing in detail example embodiments with reference to the attached drawings, in which.

DETAILED DESCRIPTION OF THE EMBODIMENTS

Figure 1:
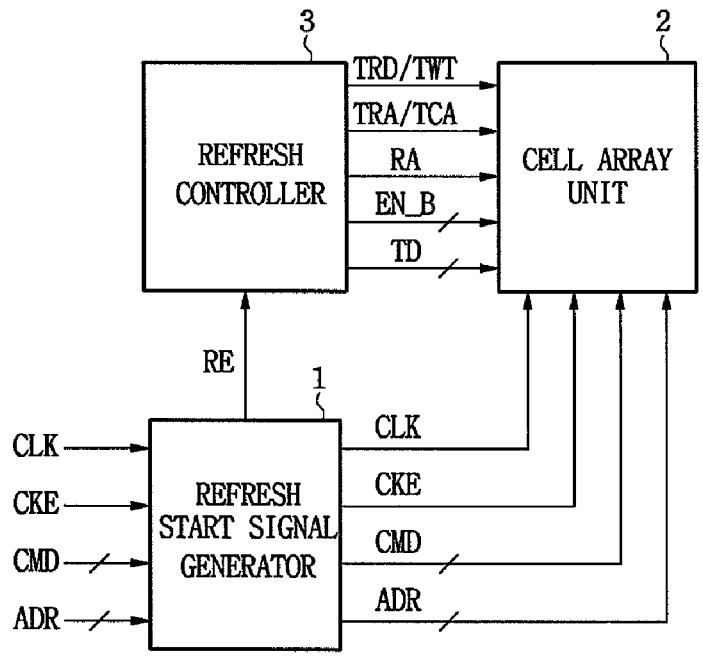
FIG. 1 illustrates a block diagram of a semiconductor memory device according to a first example embodiment.

Korean Patent Application No. 10-2009-0109879, filed on Nov. 13, 2009, in the Korean Intellectual Property Office, and entitled: "Semiconductor Memory Device and System Including the Same," is incorporated by reference herein in its entirety.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof Spatially relative terms, such as "beneath," "below," "lower," "above," "upper," and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

FIG. 1 illustrates a block diagram of a semiconductor memory device according to a first example embodiment.

In the example embodiment shown in FIG. 1, the semiconductor memory device includes a refresh start signal generator 1, a cell array unit 2, and a refresh controller 3.

An example of operation of the semiconductor memory device will be described below.

The refresh start signal generator 1 receives and transfers a command signal CMD, an address ADR, a clock signal CLK, and a clock enable signal CKE to the cell array unit 2, and generates a refresh start signal RE. When a combination of the command signal CMD indicates a self-refresh command, the refresh start signal RE is activated. The refresh start signal RE is activated when a self-refresh command is input, and deactivated when a self-refresh operation period ends. In other words, the refresh start signal RE is activated in the self-refresh operation period.

Although not shown in the drawing, the cell array unit 2 may include a row decoder, a column decoder, a cell array, and so on. The cell array includes a plurality of banks each having a plurality of blocks, and each block may have one word line or a plurality of word lines. Also, when external temperature is measured using a temperature sensor to adjust the refresh period of the cell array, each block may be set as a unit area whose temperature is measured by the temperature sensor. Meanwhile, at least one of the blocks is set as a test block for refresh period examination. For convenience, it is assumed below that each block has one word line. Here, different row addresses indicate different blocks.

When the refresh start signal RE is activated, the refresh controller 3 examines refresh periods of respective blocks constituting the cell array unit 2, stores refresh period information RIN of the respective blocks, and refreshes the blocks at two or more different refresh time intervals according to the stored refresh period information RIN.

For example, the refresh controller 3 outputs a test write signal TWT, a test row address TRA, a test column address TCA, and test data TD to the cell array unit 2. Thus, the row decoder and the column decoder of the cell array unit 2 write the test data TD into the test block in response to the test row address TRA and the test column address TCA. After this, the refresh controller 3 outputs a test read signal TRD, the test row address TRA, and the test column address TCA to the row decoder and the column decoder of the cell array unit 2. Thus, the cell array unit 2 reads the test block several times at time intervals that increase by a predetermined time and transfers the read test data TD to the refresh controller 3. For example, the test block may be read at time intervals of 10 ms, 20 ms, 30 ms, etc. that increase by 10 ms. Meanwhile, the refresh controller 3 examines data retention time of cells from the sequentially input test data TD, thereby generating and storing refresh period information of each block. At this time, entire test data needs to be set to "1" so that data retention time can be readily examined.

Figure 2:
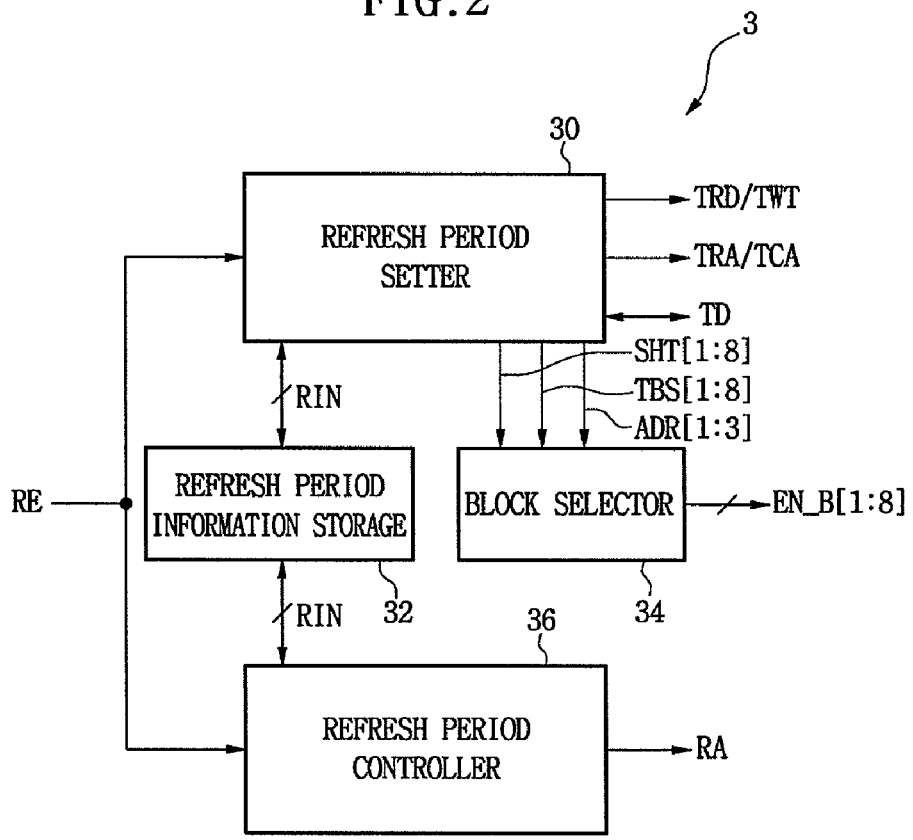
FIG. 2 illustrates a block diagram of a refresh controller of FIG. 1.

FIG. 2 illustrates an example block diagram of a refresh controller of FIG. 1.

In the example shown in FIG. 2, the refresh controller 3 includes a refresh period setter 30, a refresh period information storage 32, a block selector 34, and a refresh period controller 36.

An example operation of the refresh controller 3 will be described below.

First, when the refresh start signal RE is activated, the refresh period setter 30 drives the row decoder and the column decoder of the cell array unit 2 by the test write signal TWT, the test row address TRA, and the test column address TCA to write the test data TD as "1" into one of a plurality of blocks. The refresh period setter 30 reads the block into which the test data TD is written several times at time intervals that increase by a predetermined time, thereby examining whether or not the block has data. The read test data TD of "1" indicates that cells of the corresponding block still have the test data TD, while the read test data TD of "0" indicates that the cells of the corresponding block have been already discharged. For example, it is assumed that the basic refresh period of the cell array unit 2 is 10 ms. When the test data TD read by performing a read operation after 20 ms is "0," refresh period information is set to 10 ms. Also, when the test data TE is read to be "1" at a time point of 20 ms but becomes "0" after 30 ms, refresh period information is set to 20 ms. In this way, the data retention time of the corresponding block is examined to determine a refresh period, and the refresh period information is stored in the refresh period information storage 32.

In the example described above, the refresh period setter 30 sequentially determines refresh periods of all the blocks of the cell array unit 2 in the active period of the refresh start signal RE, that is, during the self-refresh operation period and stores the refresh periods as the refresh period information RIN. When the refresh periods of all the blocks are not examined in the self-refresh operation period, addresses of examined blocks are stored, and when the next self-refresh operation starts, the other blocks that have not yet been examined are examined.

The refresh period information storage 32 has as many registers as the number of the blocks constituting the cell array unit 2, and the respective registers store the refresh period information RIN of the respective blocks. The number of bits stored in the registers that store refresh period information RIN of the respective blocks varies according to the number of refresh periods to be implemented. For example, to perform the refresh operation of the semiconductor memory device at time intervals of 10 ms and 20 ms, information of only two refresh periods needs to be stored, and thus each register has one bit. On the other hand, to perform the refresh operation of the semiconductor memory device at time intervals of 10 ms, 20 ms, 30 ms, and 40 ms, information of four refresh periods needs to be stored, and thus each register has two bits.

The block selector 34 receives addresses ADR[1:3], test block signals TBS[1:8], and shift signals SHT[1:8] and generates block enable signals EN_B[1:8]. Here, first to eighth test block signals TBS[1] to TBS[8] constituting the test block signals TBS[1:8] correspond to first to eighth blocks, respectively. Each of the first to eighth test block signals TBS[1] to TBS[8] is set to a low level when the corresponding block is a normal block storing data, and a high level when the corresponding block is a test block for refresh period examination. The first block is a test block when the first test block signal TBS[1] is at a high level, and a normal block when the first test block signal TBS[1] is at a low level. Meanwhile, first to eighth shift signals SHT[1] to SHT[8] constituting the shift signals SHT[1:8] correspond to the first to eighth blocks, respectively. Each of the first to eighth shift signals SHT[1] to SHT[8] is set to a high or low level according to whether or not the corresponding block is shifted. The refresh period setter 30 performs refresh period examination while sequentially shifting the blocks of the cell array unit 2, which will be described in detail later.

When the refresh start signal RE is activated, the refresh period controller 36 sequentially counts a row address RA. And, the refresh period controller 36 receives the refresh period information RIN of a block corresponding to the row address RA from the refresh period information storage 32 and determines whether or not to output the row address RA according to the refresh period of the block. Since the row decoder of the cell array unit 2 receives the row address RA and refreshes respective blocks, the row decoder skips the refresh operation when the row address RA is not received. In other words, the refresh period controller 36 controls output of the row address RA according to the refresh period information RIN of each block, thereby controlling the refresh periods of the blocks.

In the example embodiment described above, a semiconductor memory device may be configured to refresh a plurality of blocks in a cell array at different time periods. Thus, in the self-refresh operation period, the refresh controller 3 examines the refresh periods of the respective blocks of the cell array unit 2, stores the refresh period information RIN of the respective blocks, and then controls the blocks to be refreshed at different time intervals according to the stored refresh period information RIN.

Figure 3:
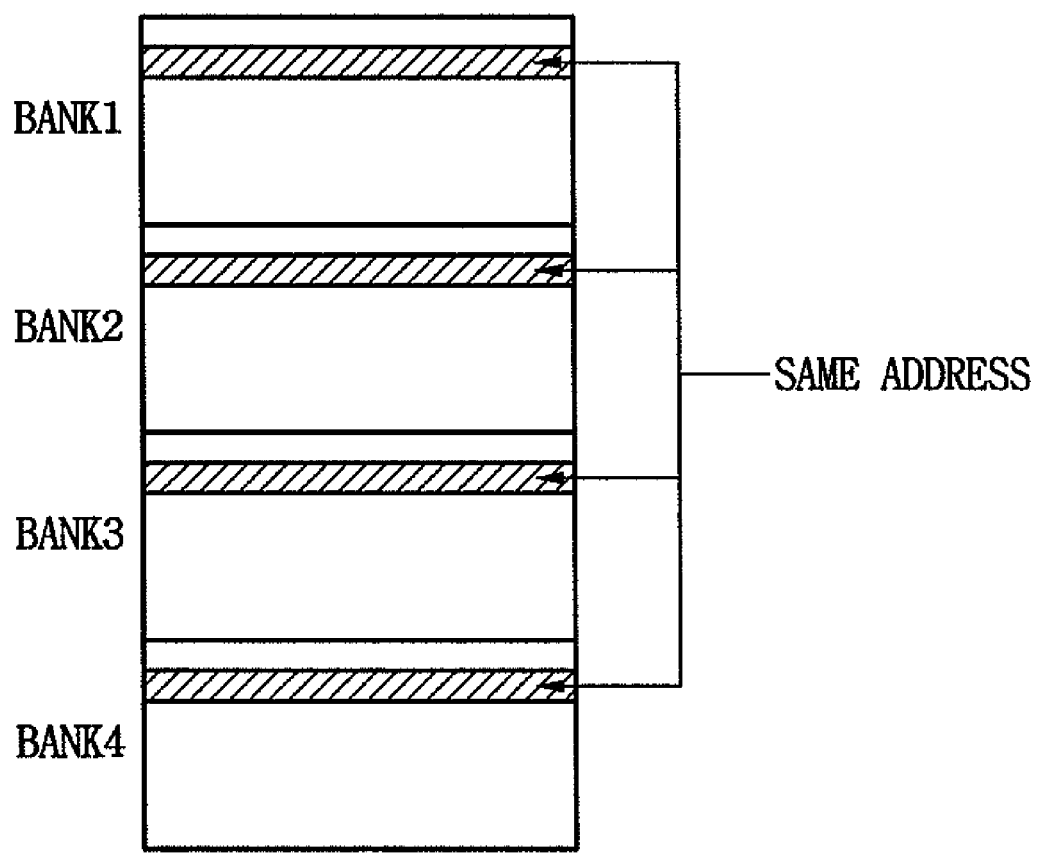
FIG. 3 illustrates a block diagram of a plurality of banks showing a refresh operation of the banks.

FIG. 3 illustrates a block diagram of a plurality of banks showing an example refresh operation of the banks.

In the example shown in FIG. 3, the cell array unit 2 has first to fourth banks BANK1 to BANK4 each having a plurality of blocks. Each of the first to fourth banks BANK1 to BANK4 has a block corresponding to the same address. Meanwhile, the refresh controller 3 sets blocks of the respective first to fourth banks BANK1 to BANK4 corresponding to the same address as test blocks.

Figure 4:
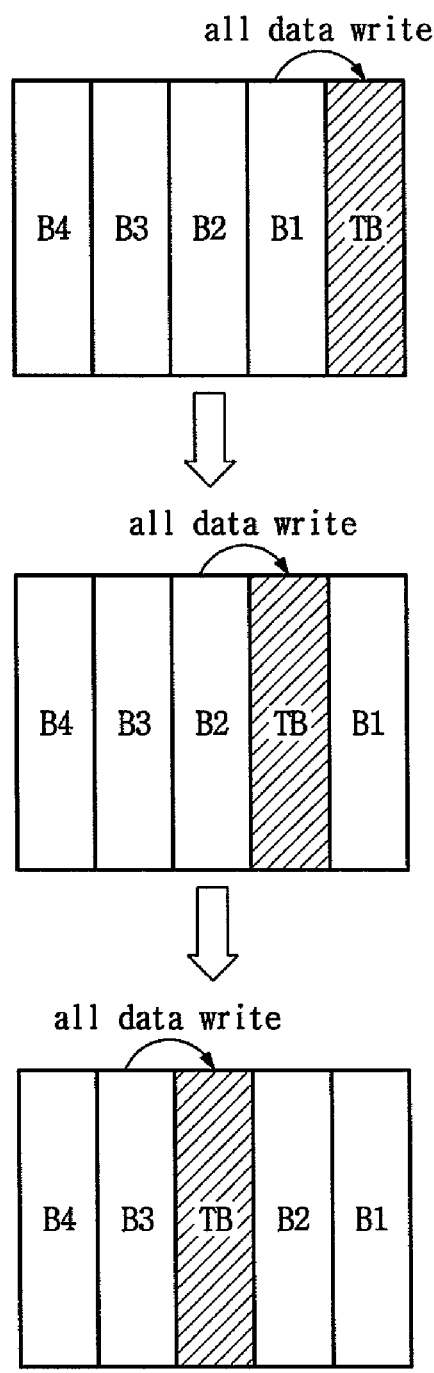
FIG. 4 illustrates a block diagram of a cell array having a plurality of blocks, illustrating an example refresh period examination method of a cell array unit.

FIG. 4 illustrates a block diagram of a cell array having a plurality of blocks, illustrating an example refresh period examination method of a cell array unit. For convenience, only five blocks are shown in FIG. 4.

In the example shown in FIG. 4, a cell array unit includes first to fourth blocks B1 to B4 and a test block TB. The test block TB is set to have the same memory capacity as each of the first to fourth blocks B1 to B4.

When a self-refresh operation period begins, a refresh period setter 12 first examines the refresh period of the test block TB. After the refresh period of the test block TB is determined and the refresh period information RIN is stored in a refresh period information storage 14, the refresh period setter 12 moves data stored in the first block B1 to the test block TB to prevent loss of the data stored in the first block B1. And, the refresh period setter 12 swaps a logical address corresponding to the first block B1 for a logical address corresponding to the test block TB. Since the logical address of the first block B1 indicates the test block TB, the test block TB becomes the first block B1. And, since the logical address of the test block TB indicates the first block B1, the first block B1 becomes the test block TB. As a result, the first to fourth blocks B1 to B4 are sequentially shifted in one direction.

Subsequently, the refresh period setter 12 examines the refresh period of the new test block TB. After storing the refresh period information of the test block TB in the refresh period information storage 14, the refresh period setter 12 moves all data of the second block B2 to the test block TB, and likewise swaps the logical address of the second block B2 for the logical address of the test block TB to exchange the second block B2 with the test block TB. In this way, the refresh period setter 12 examines refresh periods while maintaining data of the first to fourth blocks B1 to B4.

After the refresh periods of all blocks are examined in this way, a block having the shortest refresh period is exchanged with the test block to improve performance of a semiconductor memory device.

Figure 5:
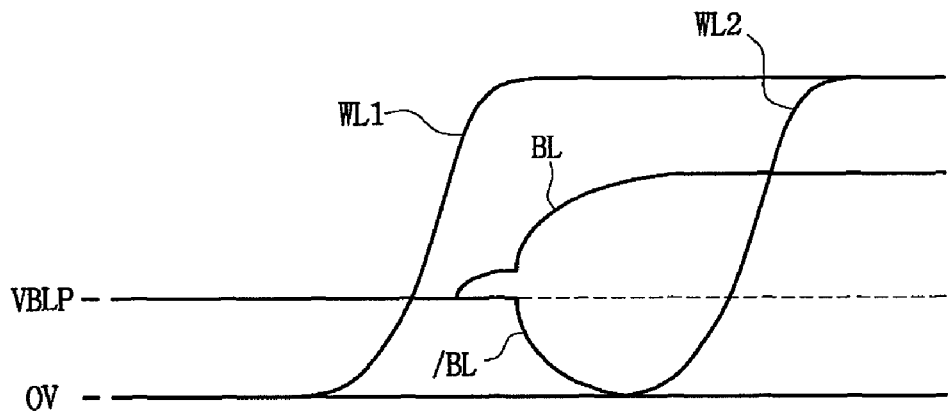
FIG. 5 illustrates an example of a method of transferring data between blocks.

FIG. 5 illustrates an example of a method of transferring data between blocks.

In the example shown in FIG. 5, operation of the cell array unit 2 will first be described in brief A row decoder of the cell array unit 2 decodes a row address and selectively activates a word line. At this time, a plurality of cells connected with the word line are activated, and data stored in the cells is loaded onto the corresponding pair of bit lines BL and /BL. As voltage difference between the bit line BL and the complementary bit line /BL gradually increases by a bit-line sense amplifier, data loaded onto the pair of bit lines BL and /BL is amplified. A plurality of word lines are connected with the pair of bit lines BL and /BL through a switching element such as a transistor.

In the example, the active periods of two word lines connected with one pair of bit lines BL and /BL overlap each other to move data between two blocks. In an example implementation, a first word line is activated to load data of a plurality of cells connected with the first word line onto the pair of bit lines BL and /BL, and then voltage difference between the bit line BL and the complementary bit line /BL is increased by a bit-line sense amplifier to amplify the data. After the voltage difference between the bit line BL and the complementary bit line /BL becomes sufficiently large, a second word line WL2 is activated with a first word line WL1 activated. At this time, pieces of data loaded onto the pair of bit lines BL and /BL are respectively transferred to a plurality of cells connected with the second word line WL2 and stored. After this, when the first word line WL1 and the second word line WL2 are deactivated in sequence, data transfer between the first word line WL1 and the second word line WL2 is completed. Since the first word line WL1 and the second word line WL2 indicate different blocks, data can be transferred between blocks in this way. When a block has a plurality of word lines, the method is used for the respective word lines a plurality of times to transfer data.

Figure 6:
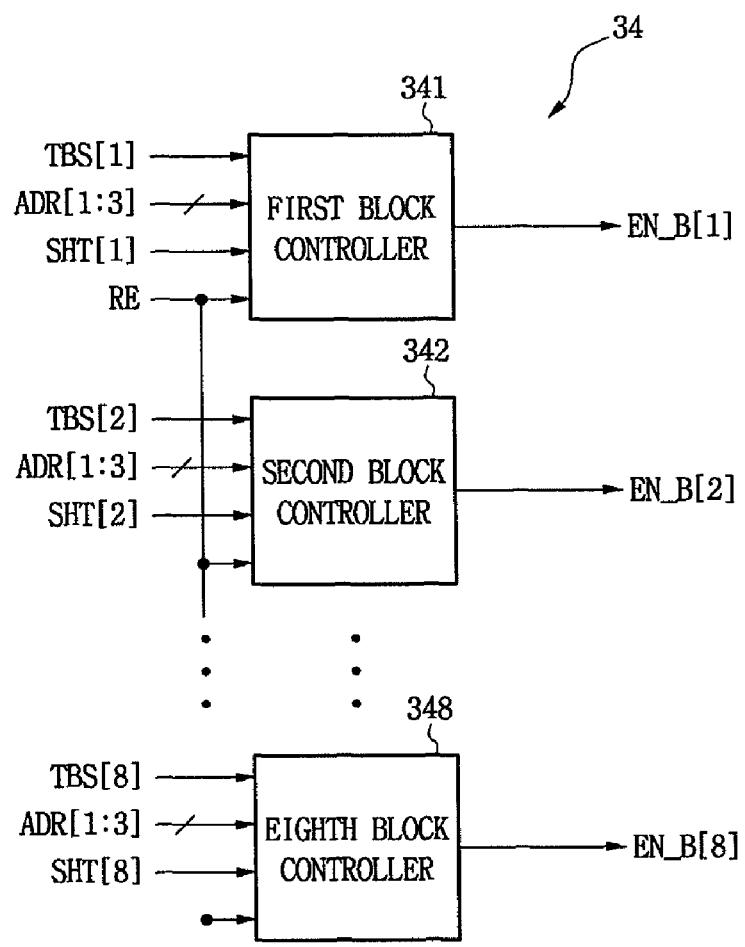
FIG. 6 illustrates a block diagram showing a constitution of a block selector of FIG. 2.

FIG. 6 illustrates an example block diagram showing a constitution of a block selector of FIG. 2.

In the example shown in FIG. 6, the block selector 34 has first to eighth block controllers 341 to 348. The block selector 34 receives the test block signals TBS[1:8], the addresses ADR[1:3], the shift signals SHT[1:8], and the refresh start signal RE, and outputs the block enable signals EN_B[1:8] for controlling whether or not to use blocks. Here, the test block signals TBS[1:8] indicate whether or not the corresponding blocks are test blocks. The addresses ADR[1:3] indicate the positions of blocks in the cell array unit 2. The shift signals SHT[1:8] indicate whether or not the corresponding blocks have been exchanged with a test block. These test block signals TBS[1:8], addresses ADR[1:3], and shift signals SHT[1:8] are prepared for respective blocks.

The block selector 34 receives the addresses ADR[1:3] and the shift signals SHT[1:8] corresponding to the respective blocks, compares the addresses ADR[1:3] and the shift signals SHT[1:8] with previously set information of the blocks to determine whether the addresses ADR[1:3] and the shift signals SHT[1:8] are the same as the previously set information, and checks whether or not the blocks are test blocks by the test block signals TBS[1:8]. For example, when the first test block signal TBS[1] is activated to a high level, the first block is set as a test block. When the addresses ADR[1:3] and the shift signals SHT[1:8] are the same as the previously set information of the blocks and the blocks are not test blocks, the block selector 34 activates the block enable signal EN_B[1:8] to use the blocks. On the other hand, when a block is a test block, the block selector 34 deactivates the corresponding one of the block enable signals EN_B[1:8] not to use the block. In this way, the block selector 34 outputs first to eighth block enable signals EN_B[1] to EN_B[8] to the cell array unit 2, thereby controlling whether or not to use first to eighth blocks.

Figure 7:
FIG. 7 illustrates pieces of information set for respective blocks.

FIG. 7 illustrates an example of pieces of information set for respective blocks.

In the example shown in FIG. 7, the addresses ADR[1:3] set for first to eighth blocks B1 to B8 have different values. All test block signals TBS corresponding to the first to eighth blocks B1 to B8 are set to "0," and a test block signal TBS corresponding to a test block TB is set to "1." Also, shift signals SHT[5:8] indicating the blocks B5 to B8 that have already been shifted and undergone refresh period examination are set to "1."

Figure 8:
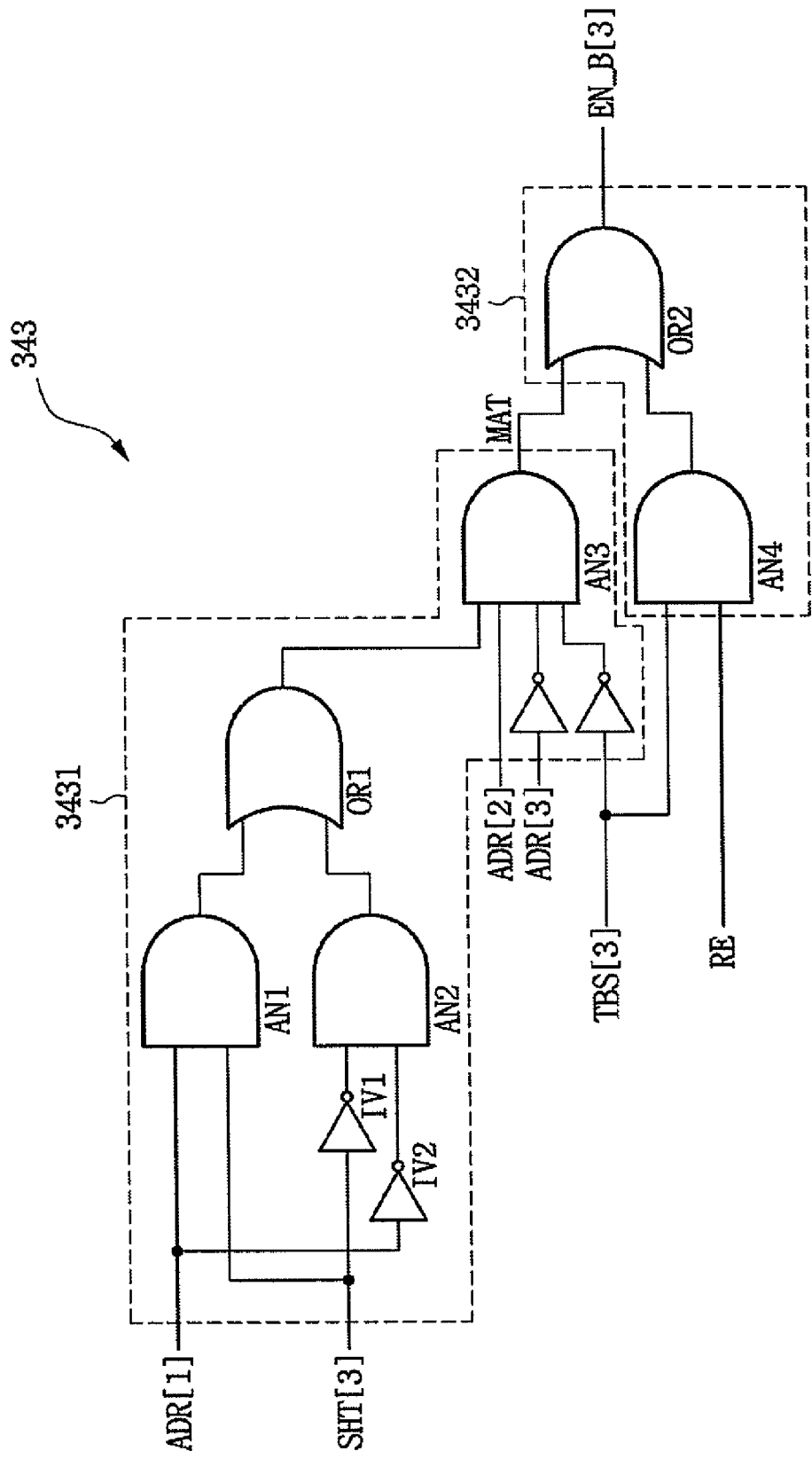
FIG. 8 illustrates a circuit diagram showing a constitution of a third block controller of FIG. 6.

FIG. 8 illustrates an example circuit diagram showing a constitution of a third block controller of FIG. 6.

In the example shown in FIG. 8, the third block controller 343 has an address input unit 3431 and a block enable signal generator 3432.

First, the third block controller 343 sets the addresses ADR [1:3], which is third block information, to "0," "1," and "0," and the shift signal SHT[3], which is third block information, to "0" before the third block B3 is shifted, and sets the addresses ADR[1:3] to "0," "1," and "1," and the shift signal SHT[3] to "1" before the third block B3 is shifted.

The address input unit 3431 receives the shift signal SHT [3] and the addresses ADR[1:3], determines whether or not the received information corresponds to the third block B3, and outputs a matching signal MAT. In an example implementation, when the shift signal SHT[3] and the addresses ADR[1:3] are input to the address input unit 3431, an AND gate AN1 performs logical conjunction on the first address ADR[1] and the shift signal SHT[3], and an AND gate AN2 performs logical conjunction on an inverted signal of the first address ADR[1] and an inverted signal of the shift signal SHT[3]. Further, an OR gate OR1 performs logical disjunction on an output signal of the AND gate AN1 and an output signal of the AND gate AN2. Then, an AND gate AN3 receives an output signal of the OR gate OR1, the second address ADR[2], an inverted signal of the third address ADR [3], and an inverted signal of the test block signal TBS[3], performs logical conjunction on them, and outputs the matching signal MAT. In brief, the address input unit 3431 activates the matching signal MAT to a high level when the input addresses ADR[1:3] and shift signal SHT[3] are the same as previously set information of the third block B3 and the corresponding block is not a test block, and deactivates the matching signal MAT to a low level when the input addresses ADR[1:3] and shift signal SHT[3] are not the same as the previously set information and the corresponding block is a test block.

Subsequently, the block enable signal generator 3432 receives the matching signal MAT, the test block signal TBS [3], and the refresh start signal RE and generates the block enable signal EN_B[3]. In an example implementation, an AND gate AN4 of the block enable signal generator 3432 receives the test block signal TBS[3] and the refresh start signal RE and performs logical conjunction on the signals, and an OR gate OR2 receives an output signal of the AND gate AN4 and the matching signal MAT, performs logical disjunction on the signals, and outputs the block enable signal EN_B[3]. In brief, when the test block signal TBS[3] is activated to a high level, the block enable signal generator 3432 activates the block enable signal EN_B[3] regardless of the matching signal MAT in the active period of the refresh start signal RE. On the other hand, when the test block signal TBS[3] is deactivated to a low level, the block enable signal generator 3432 activates the block enable signal EN_B[3] only if the matching signal MAT is activated to a high level.

In the example described above, when the third block B3 is a test block, the third block controller 343 activates the block enable signal EN_B[3] for refresh period examination in the self-refresh operation period only. When the third block B3 is not a test block, the third block controller 343 activates the block enable signal EN_B[3] only if the input address ADR [1:3] and the shift signal SHT[3] are the same as the previously set information of the third block B3.

Meanwhile, the first and second block controllers 341 and 342 and the fourth to eighth block controllers 343 to 348 operate in the same way as the third block controller 343, and thus description on the operation will be omitted.

Figure 9:
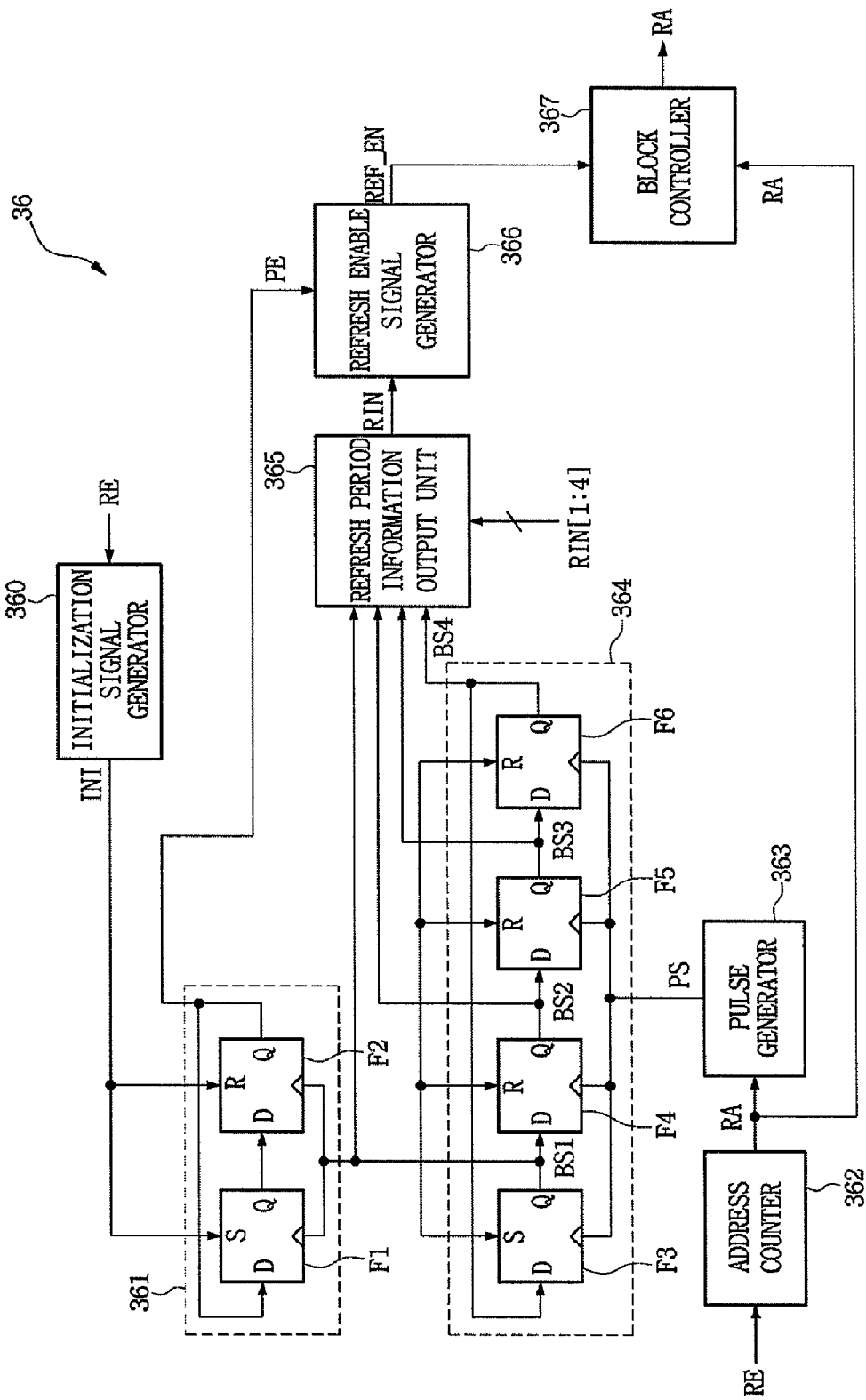
FIG. 9 illustrates a block diagram showing a constitution of a refresh period controller of FIG. 2.

FIG. 9 illustrates an example block diagram showing a constitution of a refresh period controller of FIG. 2.

In the example shown in FIG. 9, the refresh period controller 36 has an initialization signal generator 360, a first shift register 361, an address counter 362, a pulse generator 363, a second shift register 364, a refresh period information output unit 365, a refresh enable signal generator 366, and a block controller 367.

An example of operation of the refresh period controller 36 will be described below.

When the refresh start signal RE is activated, the initialization signal generator 360 outputs an initialization signal INI. The first shift register 361 has a first flip-flop F1 and a second flip-flop F2, and initializes the first and second flip-flops F1 and F2 in response to the initialization signal NI. At this time, the first flip-flop F1 is initialized in response to the initialization signal INI to output a high level signal, and the second flip-flop F2 is initialized in response to the initialization signal INI to output a low level signal. The output signal of the second flip-flop F2 is transferred to the refresh enable signal generator 366 as a period signal PE.

Meanwhile, the address counter 362 receives the refresh start signal RE and counts the row address RA. In an example implementation, the address counter 362 sequentially counts the row address RA in the active period of the refresh start signal RE that is activated in the self-refresh operation period, and initializes the row address RA and finishes operation when the refresh start signal RE is deactivated.

The pulse generator 363 generates a pulse PS every time the row address RA counted by the address counter 362 is input and transfers the pulse PS to the second shift register 364.

The second shift register 364 has third to sixth flip-flops F3 to F6, and initializes the third to sixth flip-flops F3 to F6 in response to the initialization signal INI when the self-refresh operation starts. At this time, the third flip-flop F3 is initialized in response to the initialization signal INI to output a high level signal, and the fourth to sixth flip-flops F4 to F6 are initialized in response to the initialization signal INI to output a low level signal. In the active period of the refresh start signal RE, the second shift register 364 sequentially activates first to fourth block signals BS1 to BS4 in response to the pulse PS. The first to fourth block signals BS1 to BS4 correspond to first to fourth blocks, respectively.

An example of operation of the second shift register 364 will now be described in further detail. When the self-refresh operation starts, the second shift register 364 first activates the first block signal BS1 in response to the initialization signal INI. And, when the address counter 362 counts the row address RA, the pulse PS is generated by the pulse generator 363, and the first block signal BS1 of a high level of the third flip-flop F3 is shifted to the fourth flip-flop F4. Thus, the third flip-flop F3 outputs the first block signal BS1 of a low level, and the fourth flip-flop F4 outputs the second block signal B2 of a high level. When the address counter 362 counts the row address RA, the pulse PS is generated by the pulse generator 363, and the third block signal BS3 is activated to a high level. In other words, the second shift register 364 sequentially activates the first to fourth block signals BS1 to BS4 in synchronization with counting of the row address RA.

The refresh period information output unit 365 outputs refresh period information RIN[1:4] of blocks corresponding to the activated first to fourth block signals BS1 to BS4. For example, when the third block signal BS3 is activated, the refresh period information output unit 365 outputs refresh period information RIN of the third block B3 in response to the third block signal BS3.

The refresh enable signal generator 366 receives the refresh period information RIN and the period signal PE, and activates a refresh enable signal REF_EN when a refresh period corresponding to the level of the period signal PE is input. For example, when a low level period of the period signal PE is set to correspond to a refresh period of 10 ms only and a high level period of the period signal PE is set to correspond to refresh periods of 10 ms and 20 ms, the refresh period information RIN may indicate a refresh period of 20 ms in the low level period of the period signal PE. In this case, the refresh enable signal REF_EN is deactivated, thereby controlling the refresh operation of the cell array unit 2 to be skipped.

The block controller 367 receives the refresh enable signal REF_EN and the row address RA, and controls transfer of the row address RA in response to the refresh enable signal REF_EN. As described above, since the sequentially activated first to fourth block signals BS1 to BS4 are synchronized with the counted row address RA, the refresh enable signal REF_EN and the row address RA indicate the same block. Thus, when the refresh enable signal REF_EN is deactivated and the block controller 367 does not transfer the row address RA to the cell array unit 2, the refresh operation of the block is skipped. On the other hand, when the refresh enable signal REF_EN is activated and the block controller 367 transfers the row address RA to the cell array unit 2, the refresh operation of the block is normally performed.

In the example described above, the refresh period controller 36 counts the row address RA, determines which piece of the refresh period information RIN[1:4] corresponds to a block corresponding to the row address RA, and controls output of the row address RA according to the refresh period of the corresponding block, thereby controlling the refresh operation of the block.

Figure 10:
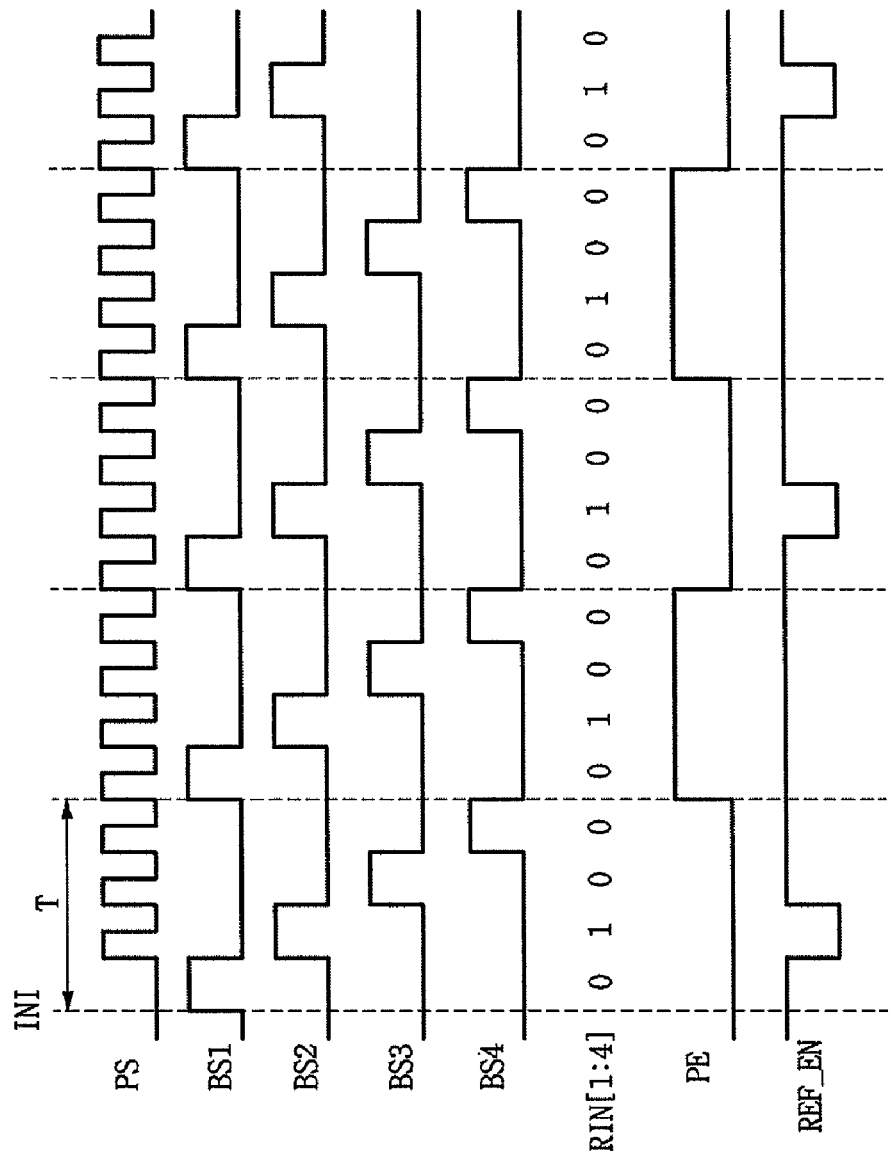
FIG. 10 illustrates waveform diagrams of signals showing operation of the refresh period controller of FIG. 9.

FIG. 10 illustrates example waveform diagrams of signals in operation of the refresh period controller of FIG. 9.

An example of operation of the refresh period controller 36 will be described below with reference to FIG. 10.

For convenience, in the example it is assumed that "0" of refresh period information RIN[1:4] indicates 10 ms and "1" of refresh period information RIN[1:4] indicates 20 ms.

Referring to FIG. 10, when the self-refresh operation starts and the initialization signal INI is input, the first block signal BS1 is activated to a high level, and the period signal PE is switched to a low level. At this time, the refresh period information output unit 365 outputs refresh period information RIN[1] of the first block corresponding to the first block signal BS1. Since the period signal PE is at a low level and the refresh period is 10 ms, the refresh enable signal generator 366 generates the refresh enable signal REF_EN of a high level.

Subsequently, when the row address RA is counted and the pulse PS is generated, the second block signal BS2 is activated to a high level. The refresh period information output unit 365 outputs refresh period information RIN[2] of the second block corresponding to the second block signal BS2. Since the period signal PE is at a low level and the refresh period is 20 ms, the refresh enable signal generator 366 deactivates the refresh enable signal REF_EN to a low level.

Subsequently, when the third and fourth block signals BS3 and BS4 are sequentially activated, the refresh period information output unit 365 outputs refresh period information RIN[3] of the third block B3 and refresh period information RIN[4] of the fourth block B4. Here, the refresh period of the third block B3 and the refresh period of the fourth block B4 are both 10 ms, and thus the refresh enable signal generator 366 switches the refresh enable signal REF_EN to a high level.

Meanwhile, when the second shift register 364 activates the respective first to fourth block signals BS1 to BS4 once in response to the pulse PS, one period T ends. Thus, the second shift register 364 sequentially activates the first to fourth block signals BS1 to BS4 again in response to the pulse PS. At this time, the first shift register 361 shifts the output signal of the first flip-flop F1 as the output signal of the second flip-flop F2 in response to the first block signal BS1, and thus the period signal PE is switched to a high level. In a high level period of the period signal PE, the refresh enable signal generator 366 activates the refresh enable signal REF_EN to a high level even if a refresh period of 20 ms for the second block is input. The row address RA is transferred to the cell array unit 2 only when the refresh enable signal REF_EN is activated. Consequently, the first, third and fourth blocks B1, B3, and B4 are refreshed at half intervals of the period signal PE, and the second block B2 is refreshed at intervals of the period signal PE.

Figure 11:
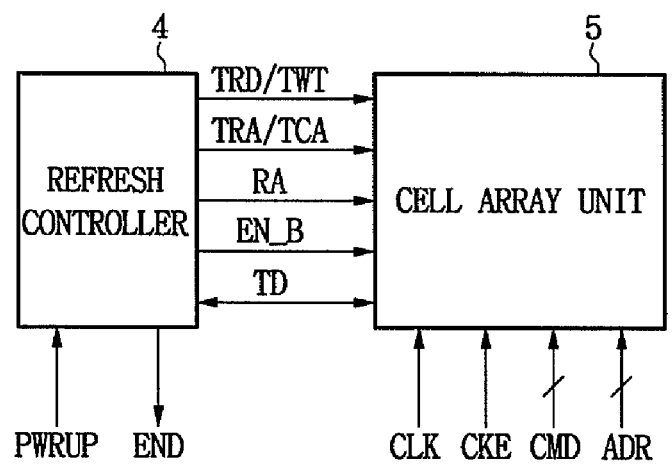
FIG. 11 illustrates a block diagram of a semiconductor memory device according to a second example embodiment.

FIG. 11 illustrates a block diagram of a semiconductor memory device according to a second example embodiment.

In the example embodiment shown in FIG. 11, the semiconductor memory device includes a refresh controller 4 and a cell array unit 5. The second example embodiment is similar to the first example embodiment. Thus, description of similar aspects will be omitted, and different aspects will be described below.

In the example embodiment shown in FIG. 11, when a power-up signal PWRUP is activated, the refresh controller 4 determines the refresh periods of respective blocks of the cell array unit 5, stores refresh period information, and outputs an end signal END after the refresh periods of all the blocks are determined. After this, the refresh controller 4 refreshes the respective blocks at two or more different time intervals according to the stored refresh period information. Here, the power-up signal PWRUP is activated when a power-up period of the semiconductor memory device ends. Also, the end signal END is activated after the semiconductor memory device determines the refresh periods of all the blocks. However, the end signal END may be automatically activated a predetermined time after the power-up signal PWRUP is activated.

The cell array unit 5 receives the command signal CMD, the address ADR, the clock signal CLK, and the clock enable signal CKE, and performs a read operation, a write operation, a refresh operation, and so on.

In the example embodiment described above, the refresh periods of respective blocks may be determined after a power-up operation is completed in the initial operation stage of the semiconductor memory device according to the second example embodiment, while the refresh periods of respective blocks may be determined during the self-refresh operation in the first example embodiment.

Figure 12:
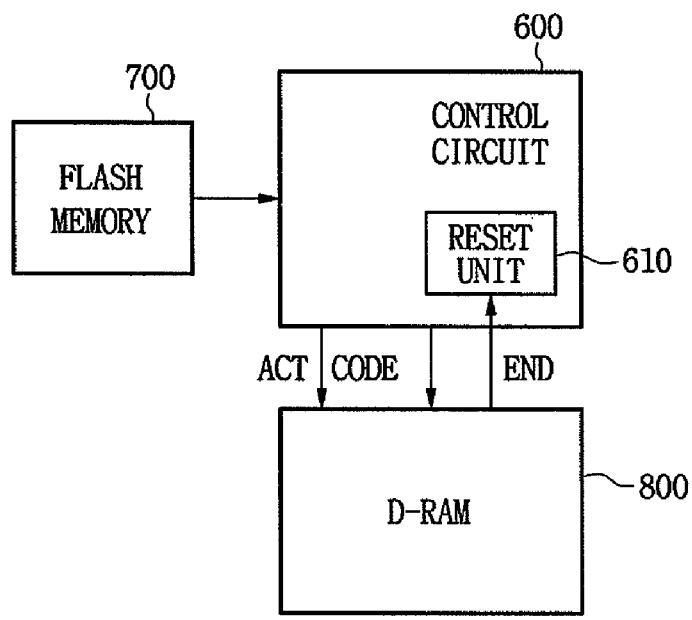
FIG. 12 illustrates a block diagram of a system including the semiconductor memory device of FIG. 11.

FIG. 12 illustrates a block diagram of an example system including the semiconductor memory device of FIG. 11.

A dynamic random access memory (DRAM) is shown as an example of a semiconductor memory device that refreshes a plurality of blocks at a plurality of different refresh time intervals.

In the example shown in FIG. 12, the system includes a control circuit 600, a flash memory 700, and a DRAM 800. The flash memory 700 is a non-volatile memory having a slower operating speed than a DRAM.

When the system is booted, boot codes BCODE stored in the flash memory 700 are transferred to the DRAM 800 through the control circuit 600. This is intended to load codes required for operation of the system into the memory area of the DRAM 800 having a faster operating speed than the flash memory 700 and increase the operating speed of the system. Meanwhile, during the booting operation of the system, the boot codes BCODE are loaded into an area corresponding to the lowermost address in the memory area of the DRAM 800. At this time, areas corresponding to upper addresses are not used, and thus the DRAM 800 performs refresh period examination beginning with the upper areas in the memory area. At this time, as described above, the DRAM 800 may also divide the memory area into a plurality of blocks, examine the refresh periods of the blocks, store the refresh period information of the blocks, and perform the refresh operation on the respective blocks at two or more different time intervals according to the refresh period information. Meanwhile, the DRAM 800 activates the end signal END after refresh period examination of the entire memory area is finished or when an active command for a block or bank whose refresh period is being examined is input. A reset unit 610 included in the control circuit 600 stops a normal operation of the control circuit 600 when the end signal END is in an inactive state. The reset unit 610 switches from the non-operation state to the operation state when the end signal END is activated, thereby allowing the control circuit 600 to perform a normal operation.

Meanwhile, when the DRAM 800 has a plurality of banks, refresh period examination may be performed on the banks except for a bank used for booting.

Figure 13:
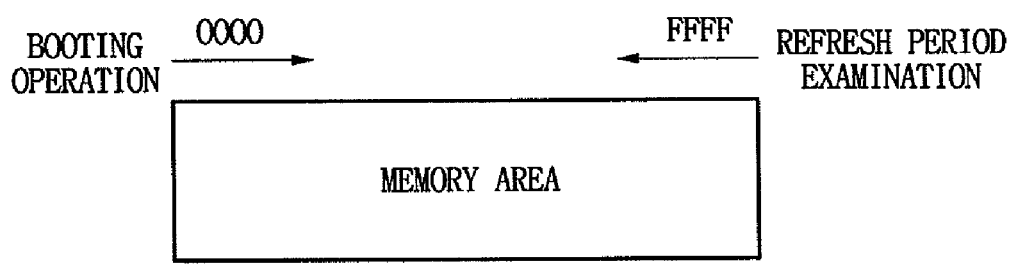
FIG. 13 illustrates a block diagram showing a memory area of a semiconductor memory device used for the booting operation of a system.

FIG. 13 illustrates a block diagram showing a memory area of an example semiconductor memory device used for the booting operation of a system.

In the example shown in FIG. 13, the booting operation is performed beginning with an area corresponding to the lowermost address in the memory area of a DRAM, and refresh period examination is performed beginning with an area corresponding to the uppermost address that is not used.

In a semiconductor memory device, the entire refresh period may be determined according to a cell having a shortest refresh period, such that data in the cell having the shortest refresh period is maintained and is not lost. In such a case, cells having long data retention times are also refreshed in accordance with the short refresh period, causing unnecessary consumption of power. In contrast, in the example embodiments described above, a semiconductor memory device and a system including the same apply different refresh periods to a plurality of blocks, which may help reduce unnecessary power consumption. The semiconductor memory device may include a cell array unit having a plurality of banks each having a plurality of blocks, and a refresh controller configured to set at least one of the blocks as a test block, perform a refresh operation on the blocks except for the test block in a self-refresh operation period, determine a refresh period of the test block, and then set another one of the blocks as the test block.

The foregoing is illustrative of example embodiments and is not to be construed as limiting thereof. Although specific terms are employed, they are used and are to be interpreted in a generic and descriptive sense only and not for purpose of limitation. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. For example, example embodiments can be applied to a measurement method for monitoring process variation in semiconductor equipment. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a cell array unit having a plurality of banks, each bank having a plurality of blocks; and
   a refresh controller configured to set at least one of the blocks as a test block, perform a refresh operation on the blocks except for the test block in a self-refresh operation period, determine a refresh period of the test block, and then set another one of the blocks as the test block.

2. The semiconductor memory device as claimed in claim 1, wherein the refresh controller sets blocks of the respective banks corresponding to the same address as the test block.

3. The semiconductor memory device as claimed in claim 1, wherein the refresh controller determines refresh periods of all the blocks and then exchanges a block having the shortest refresh period with the test block.

4. The semiconductor memory device as claimed in claim 1, wherein the refresh controller separately controls outputting a row address for controlling the refresh operation for the blocks according to the determined refresh periods.

5. The semiconductor memory device as claimed in claim 1, wherein the refresh controller includes:
a refresh period setter configured to determine refresh periods of all the blocks by examining the refresh period of the test block in response to a refresh start signal activated in the self-refresh operation period and sequentially setting the blocks as the test block, and generate refresh period information of the respective blocks;
a refresh period information storage configured to store the refresh period information;
a block selector configured to generate respective block enable signals for controlling whether or not to use the blocks, activate block enable signals corresponding to the blocks, and activate a block enable signal corresponding to the test block in an active period of the refresh start signal; and
a refresh period controller configured to sequentially determine refresh period information of the blocks when the refresh start signal is activated and control outputting a row address for controlling the refresh operation for the respective blocks according to the refresh periods.

6. The semiconductor memory device as claimed in claim 5, further comprising a refresh start signal generator configured to output the refresh start signal activated when a self-refresh command is input.

7. The semiconductor memory device as claimed in claim 5, wherein the refresh period setter determines the refresh period of the test block by writing test data into the test block in the self-refresh operation period, reading the test data several times at time intervals increasing by a predetermined time, and examining whether or not the test block has the data.

8. The semiconductor memory device as claimed in claim 5, wherein, when the refresh period of the test block is determined, the refresh period setter exchanges the block with the test block by moving data stored in one of the blocks other than the test block to the test block and swapping an address corresponding to the block for an address corresponding to the test block.

9. The semiconductor memory device as claimed in claim 5, wherein the refresh period information storage has a plurality of registers numbering as many as the blocks, the refresh period information storage being configured to store the refresh period information of the blocks respectively.

10. The semiconductor memory device as claimed in claim 5, wherein the block selector receives addresses corresponding to the blocks and shift signals, which indicate whether or not the blocks have been exchanged with the test block, activates block enable signals to use corresponding blocks when the addresses and the shift signals are the same as previously set information and the blocks are not the test block, and deactivates a block enable signal not to use a corresponding block when the block is the test block.

11. The semiconductor memory device as claimed in claim 10, wherein the block selector includes:
an address input unit configured to activate a matching signal when the shift signal and the address are the same as previously set block information and a corresponding block is not the test block, and deactivate the matching signal when the block is the test block; and
a block enable signal generator configured to activate a block enable signal in the self-refresh operation period when the corresponding block is the test block, and activate the block enable signal only if the matching signal is activated when the block is not the test block.

12. The semiconductor memory device as claimed in claim 5, wherein the refresh period controller includes:
a pulse generator configured to generate a pulse in response to the row address counted in the self-refresh operation period;
a first shift register configured to sequentially activate block signals respectively corresponding to the blocks in response to the pulse;
a second shift register configured to output a period signal whose level is changed in synchronization with operation of the first shift register;
a refresh period information output unit configured to output refresh period information of the blocks corresponding to the activated block signals;
a refresh enable signal generator configured to receive refresh period information of each of the blocks and the period signal, and generate a refresh enable signal activated when the refresh period of the block corresponds to the period signal; and
a block controller configured to receive the row address, output the row address to perform the refresh operation for the block when the refresh enable signal is activated, and prevent output of the row address to skip the refresh operation for the block when the refresh enable signal is deactivated.

13. A semiconductor memory device, comprising:
a cell array unit having a plurality of banks each having a plurality of blocks; and
a refresh controller configured to output an end signal activated after refresh periods of all the blocks are determined by repeatedly setting at least one of the blocks as a test block, determining a refresh period of the test block when a power-up period ends, and then setting another one of the blocks as the test block.

14. The semiconductor memory device as claimed in claim 13, wherein the refresh controller sets blocks of the respective banks corresponding to the same address as the test block.

15. The semiconductor memory device as claimed in claim 13, wherein the refresh controller determines refresh periods of all the blocks and then exchanges a block having the shortest refresh period with the test block.

16. The semiconductor memory device as claimed in claim 13, wherein the refresh controller separately controls outputting a row address for controlling the refresh operation for the blocks according to the determined refresh periods.

17. A system, comprising:
a control circuit configured to receive operation codes from a first memory device and output the operation codes during booting, and control operation in response to an end signal; and
a second memory having a plurality of banks each having a plurality of blocks, the second memory being configured to receive the operation codes, load the operation codes into the blocks, examine refresh periods of the blocks excluding an area in which the operation codes are stored, and output the end signal activated when an active command corresponding to a block or bank whose refresh period is being examined is input or after refresh periods of all the blocks or banks are determined.

18. The system as claimed in claim 17, wherein the first memory has a slower operating speed than the second memory.

19. The system as claimed in claim 17, wherein the control circuit includes a reset unit configured to stop a normal operation in response to the end signal when the end signal is in an inactive state, and switch from a non-operation state to the normal operation state when the end signal is activated.

* * * * *